US006770506B2

(12) United States Patent
Gogoi

(10) Patent No.: US 6,770,506 B2
(45) Date of Patent: Aug. 3, 2004

(54) RELEASE ETCH METHOD FOR MICROMACHINED SENSORS

(75) Inventor: Bishnu Gogoi, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/328,944

(22) Filed: Dec. 23, 2002

(65) Prior Publication Data

US 2004/0121506 A1 Jun. 24, 2004

(51) Int. Cl.[7] .................................................. H01L 21/00
(52) U.S. Cl. .............................. 438/52; 438/700; 216/2
(58) Field of Search ........................... 438/48–53; 216/2

(56) References Cited

U.S. PATENT DOCUMENTS

| | | | | | |
|---|---|---|---|---|---|
| 5,258,097 | A | | 11/1993 | Mastrangelo | 156/644 |
| 5,310,450 | A | | 5/1994 | Offenberg et al. | 156/630 |
| 5,576,250 | A | | 11/1996 | Diem et al. | 437/228 |
| 5,616,514 | A | | 4/1997 | Muchow et al. | 438/50 |
| 5,616,523 | A | | 4/1997 | Benz et al. | 438/50 |
| 5,750,420 | A | | 5/1998 | Bono et al. | 428/52 |
| 5,937,275 | A | | 8/1999 | Munzel et al. | 438/50 |
| 5,959,208 | A | | 9/1999 | Muenzel et al. | 73/514.32 |
| 6,030,850 | A | | 2/2000 | Kurle et al. | 438/48 |
| 6,051,866 | A | * | 4/2000 | Shaw et al. | 257/417 |
| 6,055,858 | A | | 5/2000 | Muenzel et al. | 73/504.12 |
| 6,159,385 | A | * | 12/2000 | Yao et al. | 216/2 |
| 6,369,931 | B1 | * | 4/2002 | Funk et al. | 359/223 |
| 6,401,536 | B1 | | 6/2002 | O'Brien | 73/514.38 |
| 6,465,355 | B1 | * | 10/2002 | Horsley | 438/694 |
| 6,544,898 | B2 | * | 4/2003 | Polson et al. | 438/719 |
| 2002/0127760 | A1 | * | 9/2002 | Yeh et al. | 438/50 |
| 2002/0158040 | A1 | * | 10/2002 | Lucak et al. | 216/2 |
| 2003/0060051 | A1 | * | 3/2003 | Kretschmann et al. | 438/694 |

OTHER PUBLICATIONS

U.S. patent application Ser. No. 10/238,062, O'Brien et al., filed Dec. 23, 2002.

Ishihara K., Yung C.–F., Ayon A.A., Schmidt M.A. "An inertial sensor technology using DRIE and wafer bonding with interconnecting capability" IEEE/ASME J. Microelectromech. Syst. 8, 403–408 (1999).

James M. Bustillo, Robert T. Howe, "Surface Micromachining for Microelectromechanical Systems", Proceedings of the IEEE, vol. 86, No. 8 (Aug. 1998).

* cited by examiner

*Primary Examiner*—Savitri Mulpuri
(74) *Attorney, Agent, or Firm*—John A. Fortkort; Hulsey Grether & Fortkort LLP

(57) ABSTRACT

A method for creating a MEMS structure (100) is provided. In accordance with the method, an article is provided comprising a substrate (101), a sacrificial layer (103) and a semiconductor layer (105), wherein the sacrificial layer comprises a first material such as silicon oxide. A MEMS structure is then formed in the semiconductor layer. The structure has first (107) and second (109) elements which have an exposed portion of the sacrificial layer (103) disposed between them. The first element is then released from the substrate (101) by contacting the exposed portion of the sacrificial layer (103) with a first etchant, typically by way of one or more trenches (119), after which the first element is reattached to the substrate (101) with a second material (131). The first element is then released from the substrate (101) by contacting the second material (131) with a second etchant.

18 Claims, 3 Drawing Sheets

RELEASE ETCH METHOD FOR MICROMACHINED SENSORS

FIELD OF THE INVENTION

The present invention relates generally to microfabrication techniques, and more particularly to methods for making a MEMS device.

BACKGROUND OF THE INVENTION

Advancements in micromachining and other microfabrication techniques and processes have enabled the fabrication of a wide variety of MicroElectroMechanical Systems (MEMS) and devices. These devices include moving rotors, gears, switches, accelerometers, miniaturized sensors, actuator systems, and other such structures.

One popular approach for forming MEMS devices makes use of a modified wafer known as a Silicon-On-Insulator (SOI) wafer. An SOI wafer is essentially a silicon wafer having a sacrificial layer of silicon dioxide disposed thereon, and having a thin film of active single-crystalline silicon disposed on the sacrificial layer.

FIGS. 1–3 illustrate a conventional method for creating a MEMS structure on an SOI wafer. As shown in FIG. 1, an SOI wafer is provided which comprises a silicon wafer substrate 15 having a layer of thermally grown sacrificial oxide 13 such as silicon dioxide disposed thereon. A layer of active single crystal silicon 11 is disposed over the sacrificial oxide layer. The layer of active single-crystal silicon is then masked, patterned and selectively etched to define the basic structural features of the MEMS device as shown in FIG. 2. This structure will typically then be further processed to form various features, such as metal interconnects or isolation structures, on it. After the structure is completed, the sacrificial oxide layer is partially removed by selective chemical etching to release the structure. As shown in FIG. 3, the released MEMS structure 12 typically has a cantilevered portion 17 and an anchor portion 19.

The methods currently used for the release of SOI micromachined devices are limited by the maximum undercut distance achievable with commonly used etchants such as aqueous HF. The undercut distance is the distance over which the sacrificial oxide layer can be removed by an etchant, measured as the distance from the trench where the etchant was initially brought into contact with the sacrificial oxide layer. Since the release etch occurs after the device is completed, the undercut distance is limited by the slow etch rate of the sacrificial oxide by the etchant and by the selectivity of the etchant to other materials (such as silicon nitride and metals) that are used in the interconnects, isolation structures, and other features on the completed device. Due to these limitations in the undercut distance, in devices such as SOI sensors, the proof mass is lower for the same device area than would be the case if the undercut distance were not limited. Consequently, the limitations on undercut distance require the device to be larger than would otherwise be necessary.

There is thus a need in the art for a method for producing a MEMS structure on a substrate, and particularly on SOI wafers, such that the undercut distance can be increased without adversely affecting interconnects, isolation structures, and other components on the finished device. There is also a need in the art for a method for reducing the size of SOI sensors and other such MEMS devices by increasing the undercut distance. These and other needs are met by the methodologies and devices disclosed herein and hereinafter described.

SUMMARY OF THE INVENTION

In one aspect, a method for creating a MEMS device is provided. In accordance with the method, an article, such as an SOI wafer, is provided which comprises a substrate, a sacrificial layer and a semiconductor layer, wherein the sacrificial layer comprises a first material. A MEMS structure is then formed in the semiconductor layer of the article. The MEMS structure has first and second elements which are separated from each other by a trench that exposes a portion of the sacrificial layer, and in which the first element is attached to the substrate by the sacrificial layer. The first element is then released from the substrate by contacting the sacrificial layer with a first etchant, and is subsequently reattached to the substrate with a second material which is preferably diverse from the first material. Next, metal interconnects, isolation structures, and other such device features are defined on the article, after which the first element is re-released from the substrate by contacting the second material with a second etchant. The etchant used to release the first element from the substrate may also be used to etch the second material, in which case the second material is typically chosen so that it is etched at a faster rate by the etchant than the first material. Thus, for example, if the etchant is an aqueous solution of HF, the first material may be silicon oxide and the second material may be PSG. Since the metal interconnects, isolation structures and other such device features are formed after the first element is initially released from the substrate, and since the re-release of the first element can be accomplished with much shorter etch times, the undercut distance can be increased without adversely affecting these device features, and hence the size of the device can be reduced.

In another aspect, a method for creating a MEMS device is provided. The method utilizes an article, such as an SOI wafer, which comprises a substrate, a sacrificial layer and a semiconductor layer, wherein the sacrificial layer is disposed between the substrate and the semiconductor layer. A MEMS structure is then formed in the semiconductor layer, the MEMS structure having first and second elements which are separated from each other by a trench which exposes a portion of the sacrificial layer. The first element is released from the substrate by contacting the sacrificial layer with a liquid etchant. A backfill material is then deposited in the trench such that the backfill material attaches the first element to the substrate. A metal interconnect is then formed on the article, after which the backfill material is etched.

In still another aspect a method for creating a MEMS device is provided. In accordance with the method, an article is provided which comprises a substrate, a sacrificial layer and a semiconductor layer, wherein the sacrificial layer comprises a first material. A MEMS structure is then formed in the semiconductor layer. The MEMS structure has first and second elements which are separated from each other by a trench. The first element is attached to the substrate by the sacrificial layer, and the trench exposes a portion of the sacrificial layer. The portion of the sacrificial layer which attaches the first element to the substrate is then etched, after which the first element is attached to at least one of the substrate and the second element with a second material. The first element is then released from at least one of, and preferably both of, the substrate and the second element by contacting the second material with an etchant.

These and other aspects are described in further detail below.

DETAILED DESCRIPTION

It has now been discovered that the above noted needs may be met by using a two-step release process in the fabrication of a MEMS devices. In the first step of this two-step approach, an SOI wafer or other such article is provided which comprises a substrate, a sacrificial layer, and a semiconductor layer. The basic structural features of the MEMS device are then patterned and etched in the semiconductor layer of the article. The structure is then released from the substrate by contacting the sacrificial layer with a first etchant, typically by way of one or more trenches. Since the interconnects and isolation structures have not yet been formed on the device, the selectivity of the etchant to the materials used in those features is not a consideration. Consequently, etch times can be increased, thereby increasing the undercut distance and allowing for smaller device sizes.

In the second step of the process, the structure is reattached to the substrate with a fill material, such as phosphosilicate glass (PSG), borosilicate glass (BSG), that is readily etched. The backfill material may be deposited into one or more of the trenches used to effect the release of the structure in the first step of the process. The fabrication of the MEMS structure, including the creation of any interconnects or isolation structures, is then completed, after which the structure is re-released from the substrate by contacting the fill material with an appropriate etchant. Since the backfill material is readily etched, the etch time required for re-release of the structure is minimal, and there is no adverse effect on the interconnects or isolation structures of the MEMS device.

The methodologies described herein may be understood with reference to FIGS. 4–9. The device depicted in these figures is a hypothetical MEMS device, the relevant features of which have been consolidated into a single cross-section so that the effect of each processing step on these features will be evident from a single figure. It is to be understood, however, that in an actual MEMS device, these features may not all appear in any single cross-section of the device. This point may be further appreciated with reference to FIG. 10, which illustrates a design for an actual MEMS device that may be made in accordance with the methodologies described herein.

Figure 1:
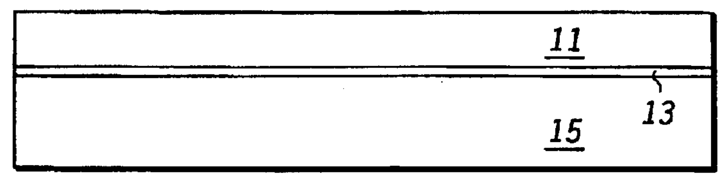
FIGS. 1–3 are illustrations of a prior art method for making a MEMS structure.
Figure 2:
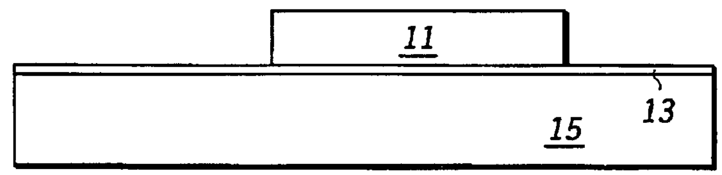
Figure 3:
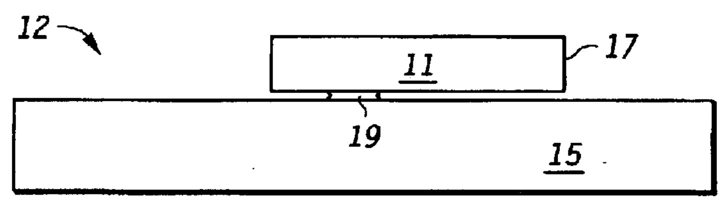
Figure 4:
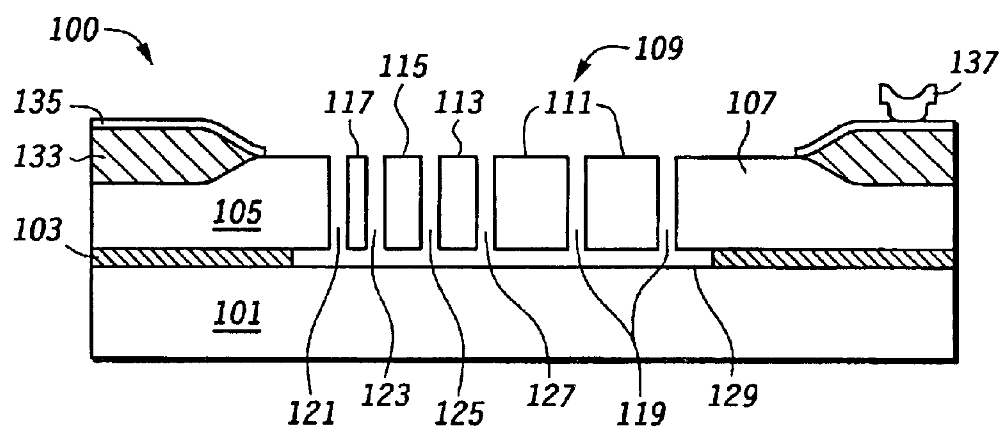
FIG. 4 is an illustration of a MEMS device made in accordance with the teachings herein.

FIG. 4 depicts the general features of the aforementioned hypothetical MEMS device 100 made in accordance with the teachings herein. The MEMS device is created on an SOI (silicon on insulator) wafer comprising a silicon substrate 101, a sacrificial layer 103 and a semiconductor layer 105. The device has an anchor portion 107 and a suspended portion 109.

The suspended portion of the device is equipped with a proof mass area 111, at least one moving finger 113, at least one fixed finger 115, and a spring suspension 117. The structure contains a horizontal trench 129 which was created during the initial release of the structure by contacting the sacrificial layer with an etchant via vertical trenches 119, 121, 123, 125, 127, and 129.

The device is also equipped with metallic interconnects (not shown) and bond pads 137 which are electrically isolated from the MEMS structure by way of dielectric layers 133 and 135. These layers may be, for example, oxide and nitride layers, respectively. The dielectric layer 135 is meant to isolate the conductive parts of the device from each other and the field area. The interconnects, which may comprise various metals or polysilicon and may be present as one or more layers disposed over portions of the device, form electrical connections between the different conductive parts of the device and the bond pads.

Figure 5:
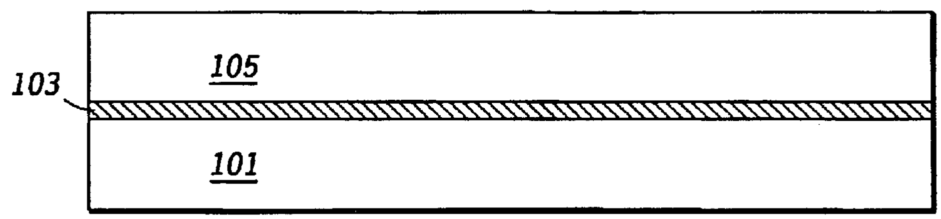
FIGS. 5–9 are illustrations depicting the methodology used to achieve the device of FIG. 4.

FIGS. 5–9 illustrate one possible process sequence for the fabrication of the MEMS device depicted in FIG. 4. As shown in FIG. 5, the process begins with an SOI wafer or other article which contains a substrate 101, a sacrificial layer 103 and a semiconductor layer 105. The substrate may be, for example, a silicon wafer, while the sacrificial layer is preferably a material, such as silicon oxide, which can be readily etched to release from the substrate a structure defined in the semiconductor layer. The semiconductor layer is preferably a material, such as epitaxial silicon, from which MEMS elements can be fabricated.

Figure 6:
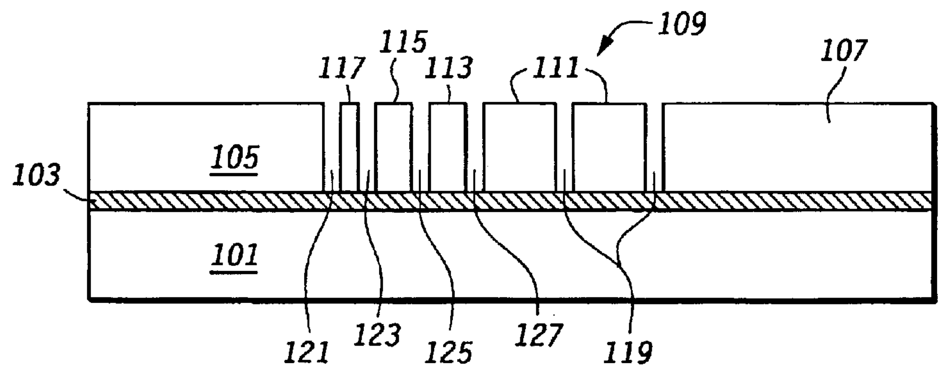

As shown in FIG. 6, the SOI wafer is then patterned and etched using a dry reactive ion etch (DRIE) to define the structural features of the sensor in the semiconductor layer 105. The structural features in the particular device depicted include an anchor area 107 and a suspension area 109. The suspension area comprises a proof mass 111, a movable finger 113, a fixed finger 115, and a spring suspension 117. The proof mass is provided with a series of etch holes 119 to effect release of the structure. Trenches 121, 123, 125 and 127 define the structural features and provide additional access to the sacrificial layer.

Figure 7:
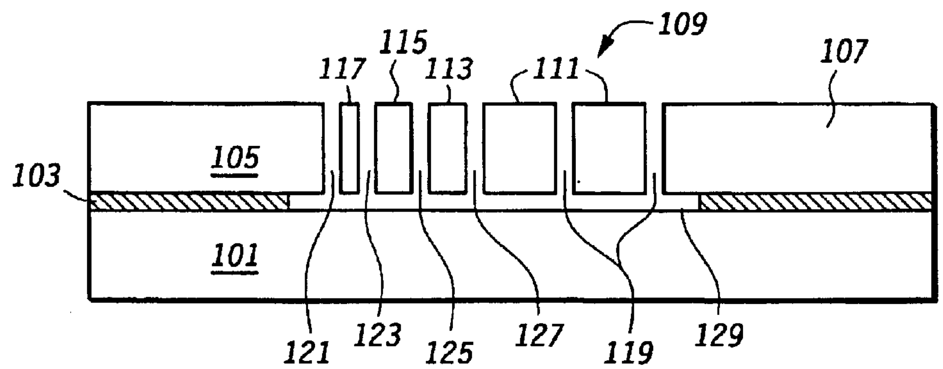

As shown in FIG. 7, the first release of the structure is effected by undercutting the sacrificial layer 103 that extends below the suspension area 109 of the device, resulting in the formation of a horizontal trench 129. As previously noted, the etch time is not limited by selectivity of the etch to the various non-structural features of the device, because the interconnects and isolation structures have not yet been formed on the device. Moreover, the selectivity of commonly used release etches, such as aqueous HF solutions, are highly selective to the silicon wafer and epitaxial silicon used as the substrate 101 and semiconductor layer 105, respectively, in typical SOI devices. Consequently, the etch time at this point in the process is set by the undercut distance desired below the anchor area of the device, which in turn is typically determined by the spacing between the etch holes.

FIG. 7 depicts release occurring by the complete removal of a portion of the buried oxide layer. However, it is to be understood that release may also occur with incomplete removal of a portion of the buried oxide layer. Indeed, in some applications, incomplete removal may be preferred, since the presence of some of the buried oxide provides additional support for the device layer during subsequent processing steps as compared to the case where the entire portion of the buried oxide layer has been removed. On the other hand, removal of at least some of the portion of buried oxide layer has the above noted advantage of reducing the etching time required for final release.

Figure 8:
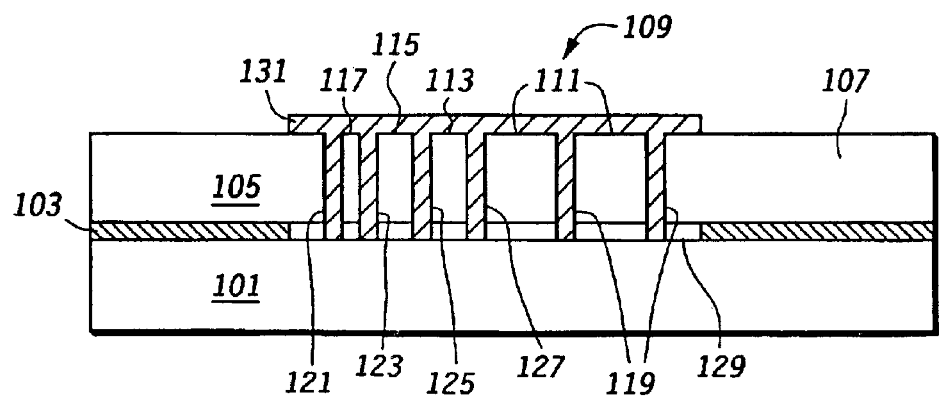
Figure 9:
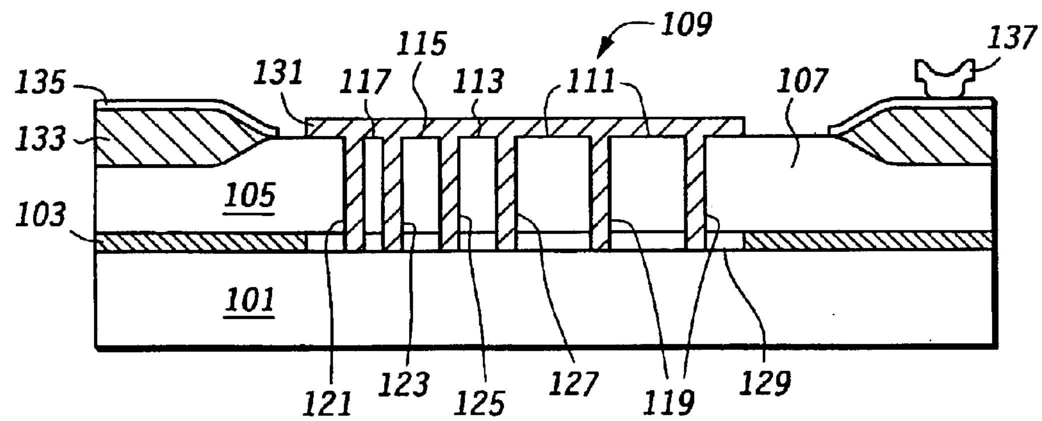

As shown in FIG. 8, the vertical trenches in the device are then backfilled by a second material 131. This second material is typically a material that is easily etched, such as phosphosilicate glass (PSG). Preferably, the trenches will be backfilled sufficiently such that the previously released components of the structure are again attached to the substrate, this time by the easily etched material, and/or are attached by way of the easily etched material to adjacent components that are themselves attached to the substrate. As shown in FIG. 9, the resulting device may then be subjected to conventional processing to define bond pads 137, dielectric isolation layers 133 and 135, metallic interconnects (not shown) and other such features as are found on conventional MEMS devices. After fabrication of the MEMS device has been completed, it may then be re-released from the substrate by etching material 131 with a suitable etchant. Since material 131 is typically selected as a material that is readily etched, etching times required for re-release of the structure are dramatically reduced compared to those required for the initial release. Consequently, selectivity of the etch to the materials of the interconnects and isolation structures is less critical, and these elements are not adversely affected by the etch. The released structure is depicted in FIG. 4.

In the specific embodiment described above, PSG is used as the second material 131 used as the fill depicted in FIGS. 4, 8 and 9. However, one skilled in the art will appreciate that several other materials may be used as the fill. Such other materials may include, for example, $SiO_2$, $Si_3N_4$, borosilicate glass (BSG), borophosphosilicate glass (BPSG), tetraethoxysilicate (TEOS), and undoped silicon glass (USG). Indeed, it is even possible in some embodiments that the backfill material may be the same as the material of the sacrificial layer originally present on the wafer, since the backfill material typically only partially fills the trench 129 created in the initial release, and thus requires much less time to etch than the original sacrificial layer. The exact choice of materials for a given application may depend, for example, on such factors as the composition of the other features or components that will be present on the device at the time that the second etch is carried out, the choice of etchants, and the selectivity of those etchants to the materials of these features or components. It is also possible in some embodiments that the backfill material 131 is a water soluble material, thus allowing water to be used as the second etch.

Various etchants may be used in the methodologies described herein. The choice of etchants will depend on various factors, such as the composition of the substrate, dielectric layer or semiconductor layer, the composition of components or features present on the article at the time of etch, and the selectivity of a prospective etch. Preferably, the etchant is an aqueous HF solution, although the etchant may also be HF with various concentrations of acetic acid. These materials may be used as aqueous or organic solvent based solutions, and the solutions may be buffered. In some applications, vapor phase HF may also be used to effect release of the semiconductor structure.

In the methodology depicted in FIGS. 5–9, the backfill material 131 is shown as completely filling the trench so that the material extends from the substrate and overlaps the outer surface of the semiconductor layer. However, one skilled in the art will appreciate that, in many applications, the degree of backfill may vary. Thus, for example, in some applications, it may be sufficient to backfill the trenches only enough so that the MEMS structure is reattached to the substrate, or so that the trenches are only filled up to the outer surface of the semiconductor layer or to some point below the outer surface. It may also be possible to use more than one material for the backfill, or to selectively backfill only some of the trenches so that some of the trenches are left unfilled.

Figure 10:
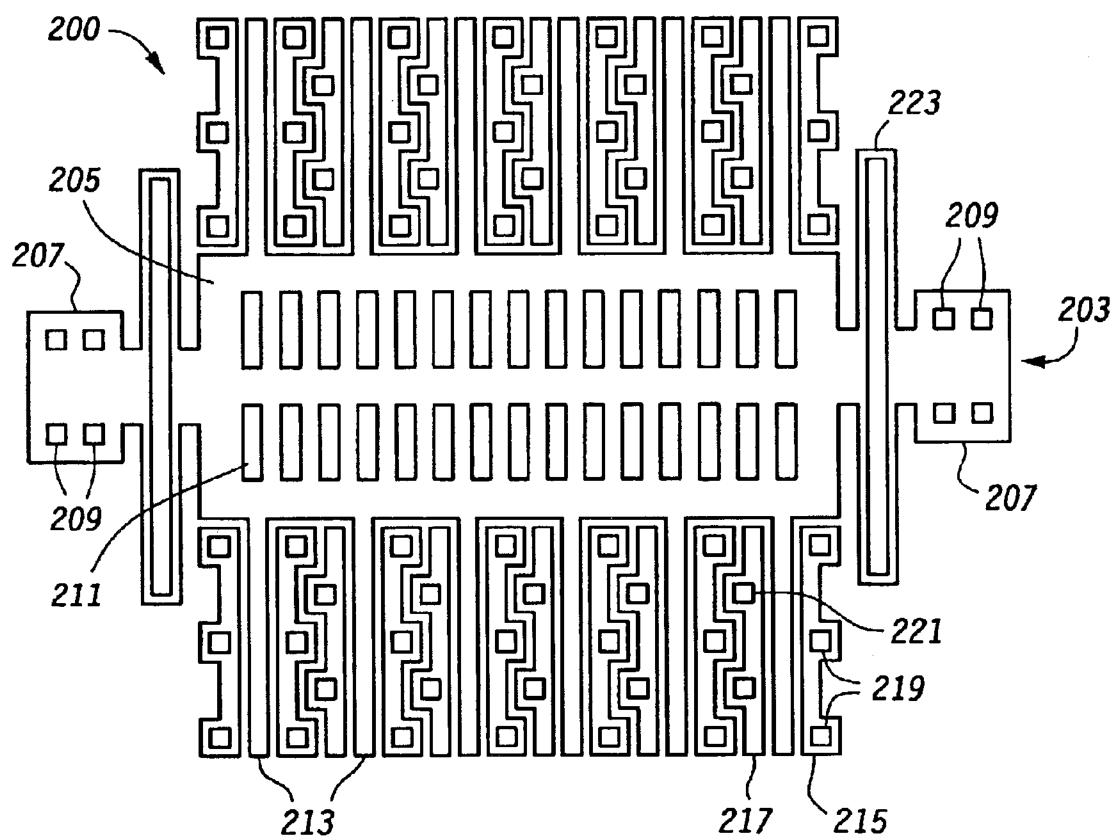
FIG. 10 is an illustration of an accelerometer that can be made in accordance with the methodologies taught herein.

FIG. 10 illustrates one possible design for a MEMS device (in this case, an accelerometer) that can be made using the methodologies described herein, it being understood that a wide variety of other designs and devices are achievable with these methodologies. The device 200 has a proof mass area 203 with a suspended portion 205 and an anchored portion 207. The anchored portion is attached to a substrate (not shown) by a plurality of proof mass anchors 209. The suspended portion has a plurality of etch holes 211 therein and is equipped with a plurality of moving fingers 213. Each of the moving fingers is disposed between first 215 and second 217 fixed fingers, which are anchored by first 219 and second 221 sets of anchor fingers, respectively. A spring 223 is disposed between the suspended portion and the anchored portion of the device. Through the use of the methodologies described herein, the undercut distances used in the fabricated of the device 200 of FIG. 10 can be increased. Hence, the distance between the etch holes 211 can be increased, thus increasing the amount of proof mass 203 per unit area and reducing the overall size of the device.

Methods have been provided herein for producing a MEMS structure on a substrate, and particularly on an SOI wafer, which allow the undercut distance to be increased without adversely affecting the metal interconnects, isolation structures, or other components and features on the finished device. These methods allow for reductions in device size.

The above description of the invention is illustrative, and is not intended to be limiting. It will thus be appreciated that various additions, substitutions and modifications may be made to the above described embodiments without departing from the scope of the present invention. For example, in many embodiments of the methodologies and devices disclosed herein, the perimeter trench is shown as terminating at the substrate. However, it will be appreciated that, in many applications, the perimeter trench may be made to extend into the substrate. Moreover, the thicknesses and compositions of the various layers, and the etches employed, are not limited to those specifically mentioned. Accordingly, the scope of the present invention should be construed solely in reference to the appended claims.

What is claimed is:

1. A method for creating a MEMS device, comprising the steps of:

providing an article comprising a substrate, a sacrificial layer and a semiconductor layer, wherein the sacrificial layer comprises a first material;

forming, from the semiconductor layer, a semiconductor MEMs structure having first and second elements which are separated from each other by a trench, wherein the first element is attached to the substrate by the sacrificial layer, and wherein the trench exposes a portion of the sacrificial layer;

releasing the first element from the substrate by contacting the sacrificial layer with a first etchant through the trench;

depositing a second material over the semiconductor layer and in the trench to reattach the first element to the substrate, said second material being selected from the group consisting of silicon nitride and doped and undoped silicon oxides; and re-releasing the first element from the substrate by contacting the second material with a second etchant through the trench, wherein a metal is deposited over the semiconductor MEMs structure after the first element is reattached to the substrate but before the first element is re-released, and, wherein, after the first element is re-released, the first element is a moving element and the second element is a fixed element.

2. The method of claim 1, wherein the etchant used to release the first element from the substrate is also used to etch the second material, and wherein the etchant etches the second material at a faster rate than it etches the first material.

3. The method of claim 1, further comprising the step of forming an interconnect from the metal after the first element is reattached to the substrate but before the first element is re-released.

4. The method of claim 1, further comprising the step of forming an isolation structure within the semiconductor MEMs structure after the first element is reattached to the substrate but before the first element is re-released.

5. The method of claim 1, wherein the second material is PSG.

6. The method of claim 1, wherein the article is an SOI wafer.

7. The method of claim 1, wherein the sacrificial layer comprises silicon oxide, and wherein the semiconductor layer comprises silicon.

8. The method of claim 1, wherein the first and second materials are diverse.

9. The method of claim 1, wherein each of the first and second etchants comprise aqueous solutions of HF.

10. The method claim 1, wherein the first element is released from both the second element and the substrate by contacting the second material with an etchant.

11. The method of claim 1, wherein said doped oxide is selected from the group consisting of BSG, BPSG, TEOS, and USG.

12. A method for creating a MEMS device, comprising the steps of:

providing an article comprising a substrate, a sacrificial layer and a semiconductor layer, wherein the sacrificial layer is disposed between the substrate and the semiconductor layer;

forming a semiconductor MEMs structure from the semiconductor layer, said semiconductor MEMs structure having first and second elements which are separated from each other by a trench which exposes a portion of the sacrificial layer;

releasing the first element from the substrate by contacting the sacrificial layer with a liquid etchant through the trench;

depositing a backfill material in the trench such that the backfill material attaches the first element to the substrate, wherein the backfill material is selected from the group consisting of silicon nitride and doped or undoped oxides;

forming a metal interconnect on the article; and then etching the backfill material to re-release the first element, wherein, after the first element is re-released, the first element is a moving element and the second element is a fixed element.

13. The method of claim 12, wherein the etchant used to release the first element from the substrate is also used to etch the backfill material, and wherein the etchant etches the backfill material at a faster rate than it etches the material of the sacrificial layer.

14. The method of claim 12, further comprising the step of forming an isolation structure over the semiconductor MEMs structure after the first element is released from the substrate but before the backfill material is etched.

15. The method of claim 12, wherein, after the backfill material is etched, the fist element is a moving element and the second element is a fixed element.

16. The method of claim 12, wherein the backfill material is PSG.

17. The method of claim 12, wherein doped oxide is selected from the group consisting of BSG, BPSG, TEOS, and USG.

18. The method of claim 12, wherein the article is an SOI wafer.

* * * * *

UNITED STATES PATENT AND TRADEMARK OFFICE

CERTIFICATE OF CORRECTION

PATENT NO. : 6,770,506 B2
DATED : August 3, 2004
INVENTOR(S) : Gogoi, Bishnu

It is certified that error appears in the above-identified patent and that said Letters Patent is hereby corrected as shown below:

Tilte page,
Item [56], References Cited, OTHER PUBLICATIONS, please delete "December 23, 2002" and insert -- September 9, 2002 --.

Column 8,
Line 9, please delete "nitride" and insert therefor -- nitrides --.
Line 10, after "undoped", please add -- silicon --.

Signed and Sealed this

Seventh Day of June, 2005

JON W. DUDAS
*Director of the United States Patent and Trademark Office*